United States Patent
Kim

(10) Patent No.: US 8,300,124 B2
(45) Date of Patent: Oct. 30, 2012

(54) IMAGE SENSOR MODULE AND CAMERA MODULE PACKAGE HAVING THE SAME

(75) Inventor: Kun Kim, Suwon (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 1636 days.

(21) Appl. No.: 11/582,406

(22) Filed: Oct. 18, 2006

(65) Prior Publication Data

US 2007/0126899 A1    Jun. 7, 2007

(30) Foreign Application Priority Data

Nov. 25, 2005  (KR) .................... 10-2005-0113823

(51) Int. Cl.
*H04N 3/14* (2006.01)
*G03B 17/00* (2006.01)

(52) U.S. Cl. ....................................... 348/294; 396/542
(58) Field of Classification Search .................. 396/542; 348/294

See application file for complete search history.

(56) References Cited

U.S. PATENT DOCUMENTS

| | | | | |
|---|---|---|---|---|
| 6,291,775 B1* | 9/2001 | Saitoh | ............ | 174/250 |
| 6,392,898 B1* | 5/2002 | Asai et al. | ............ | 361/794 |
| 6,484,303 B2* | 11/2002 | Kitada | ............ | 716/54 |
| 6,563,148 B2* | 5/2003 | Kawashima et al. | ......... | 257/202 |
| 7,714,417 B2* | 5/2010 | Nonoyama | ........... | 257/669 |
| 2005/0139848 A1* | 6/2005 | Yee | ............ | 257/98 |
| 2006/0086890 A1* | 4/2006 | Chao et al. | ......... | 250/208.1 |
| 2007/0108628 A1* | 5/2007 | Ozawa et al. | ......... | 257/778 |

FOREIGN PATENT DOCUMENTS

| | | |
|---|---|---|
| CN | 2566454 | 8/2003 |
| JP | 7-99214 | 4/1995 |
| JP | 2003-100999 | 4/2003 |
| JP | 2004-96638 | 3/2004 |
| JP | 2004-247611 | 9/2004 |
| JP | 2004-259755 | 9/2004 |
| JP | 2005-116628 | 4/2005 |
| KR | 10-2004-0002770 | 1/2004 |
| KR | 10-2005-0110752 | 11/2005 |

OTHER PUBLICATIONS

English Translation of the Chinese Office Action issued Aug. 7, 2009 in corresponding Chinese Patent Application 200610138184.3.
Japanese Office Action issued on Mar. 31, 2009 in corresponding Japanese Patent Application 2006-310551.
Office Action mailed on Jun. 13, 2008 and issued in corresponding Chinese Patent Application No. 200610138184.3.

* cited by examiner

*Primary Examiner* — Aaron Strange

(57) ABSTRACT

An image sensor module comprises an image sensor including a pixel region picking up an image from light incident from the outside and a signal processing region having bumps formed in the outer portion of the image sensor so as to process an electrical signal with respect to the image picked up by the pixel region; and a board attached to the image sensor by a liquid adhesive and provided with a window such that the pixel region of the image sensor receives light, the board including: a first dummy pattern formed on at least a portion around the window; a circuit pattern formed in a position spaced in a predetermined distance outward from the first dummy pattern; and board-side pads electrically connected to the circuit pattern so as to come in contact with the bumps formed in the image sensor.

9 Claims, 7 Drawing Sheets

[FIG. 1]
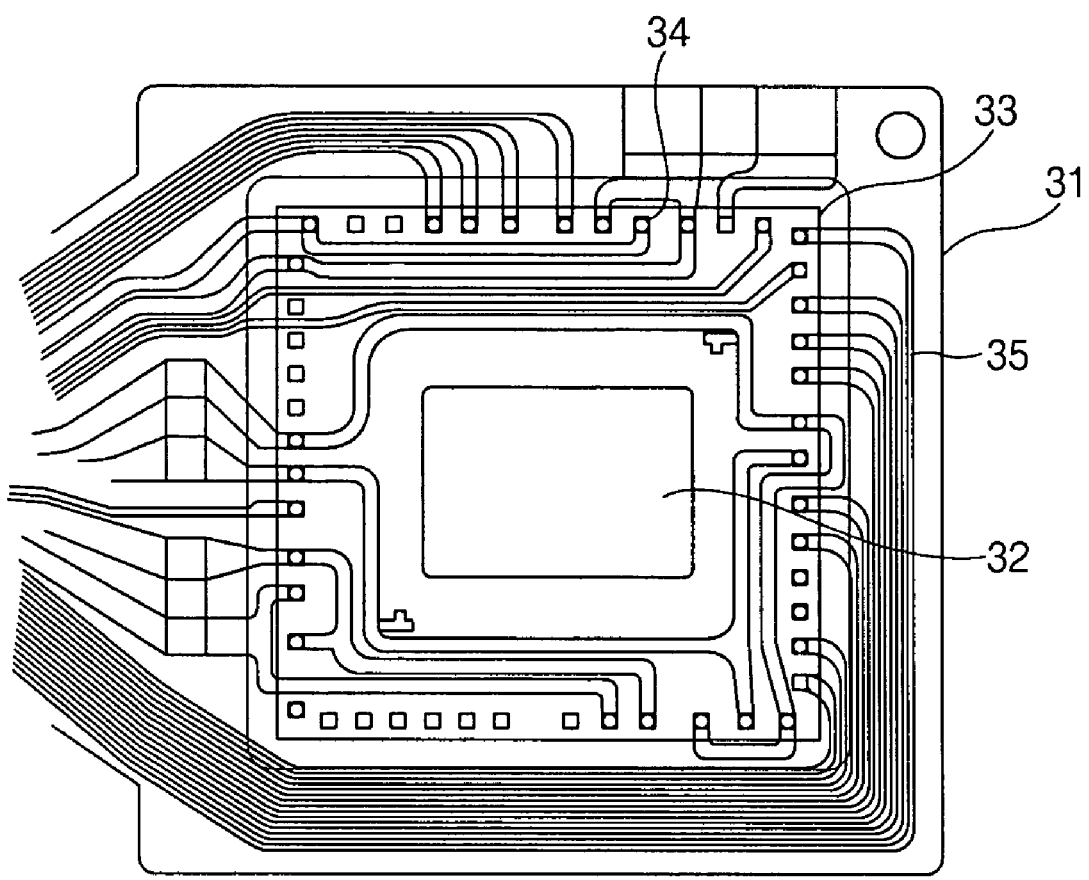

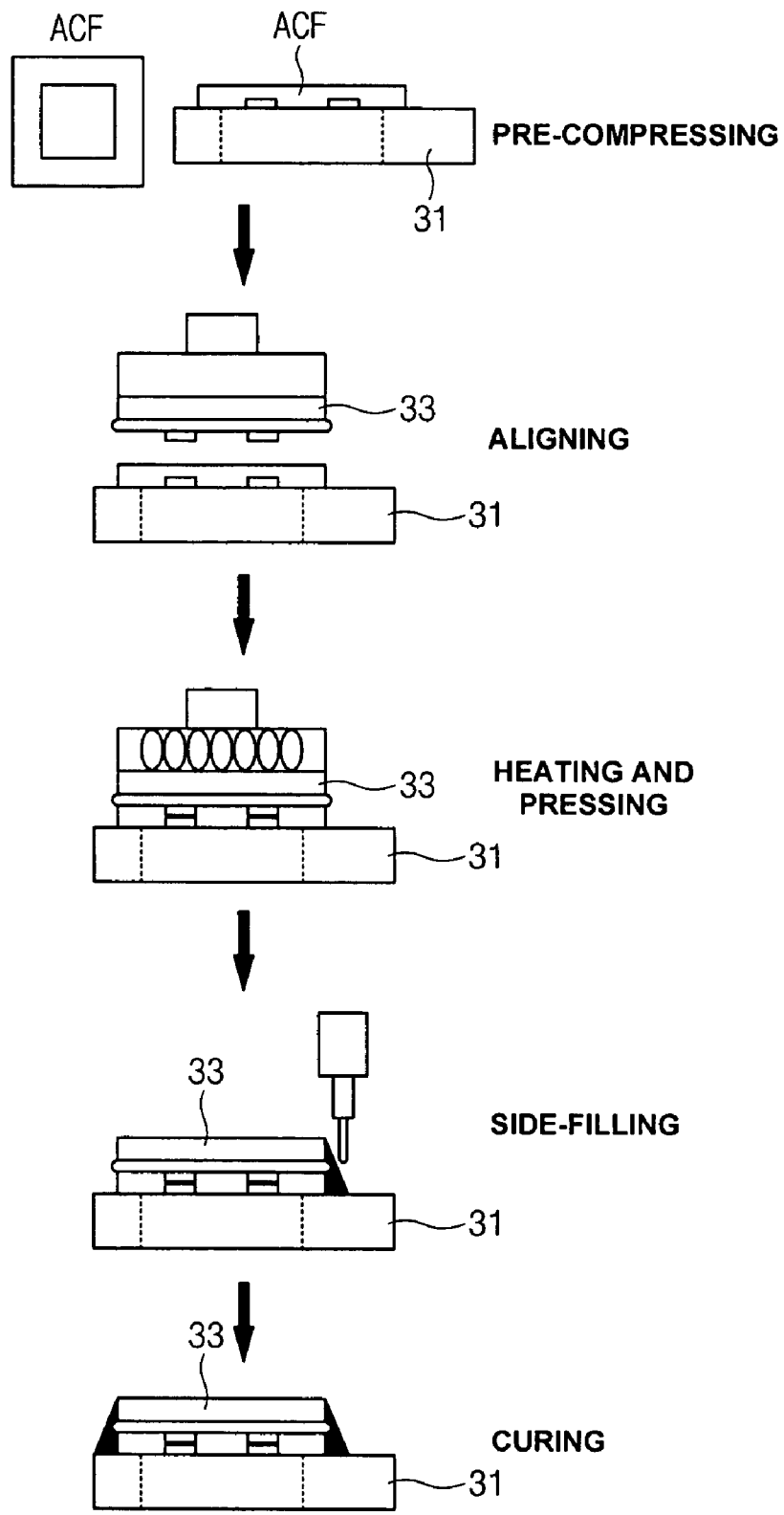
[FIG. 2]

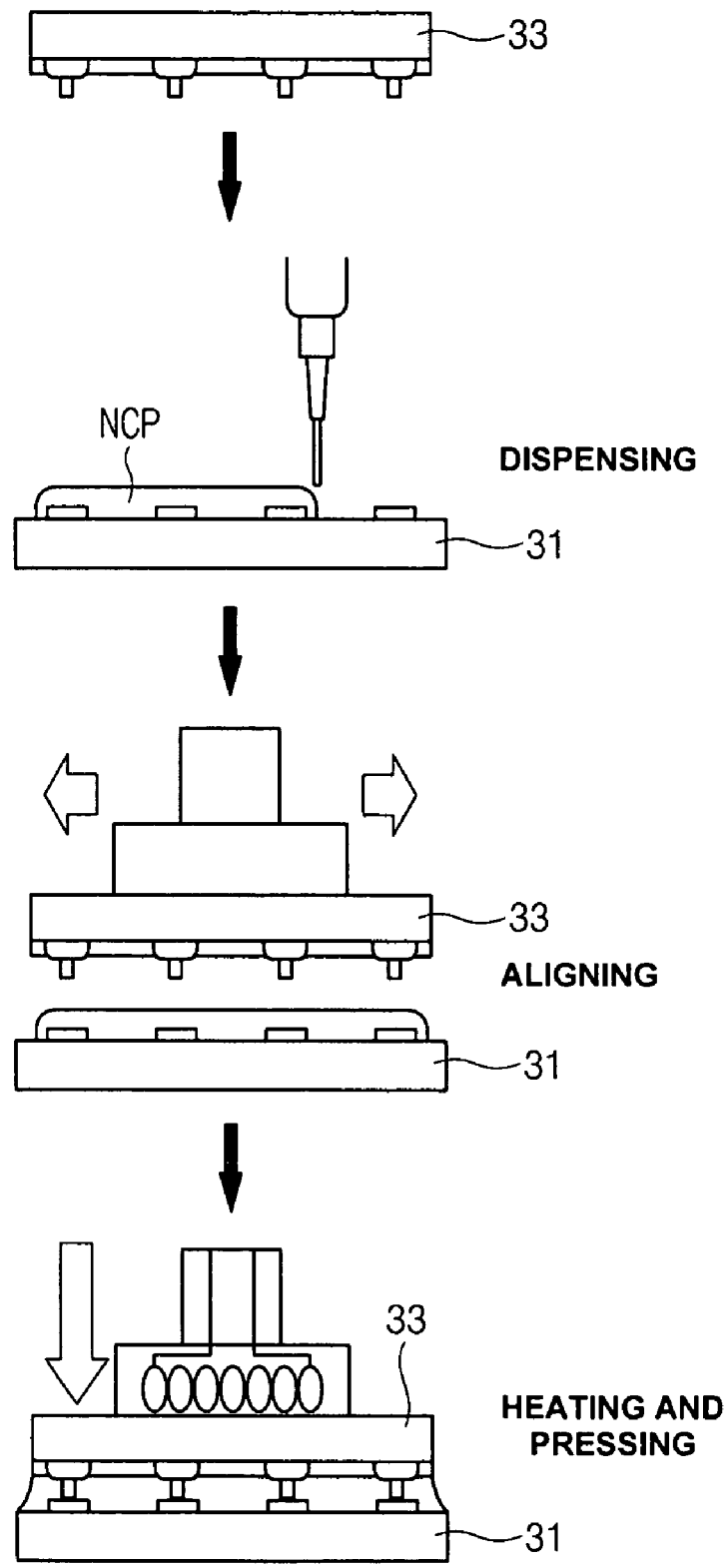

[FIG. 4]
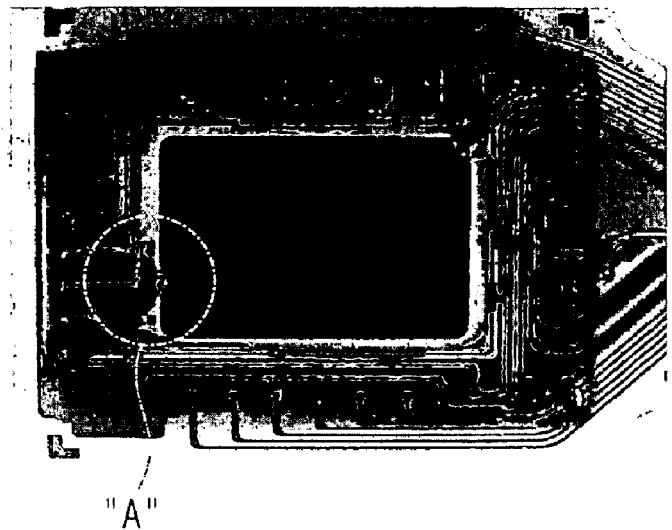
"A"
[FIG. 5]
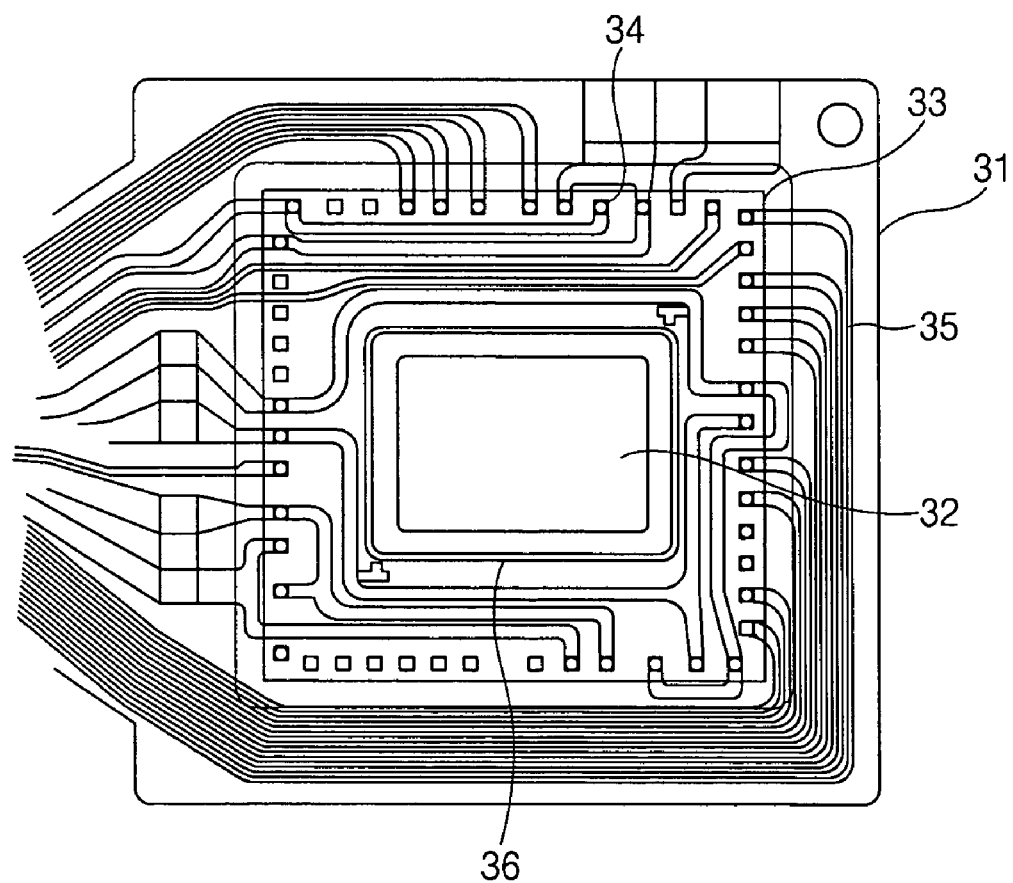

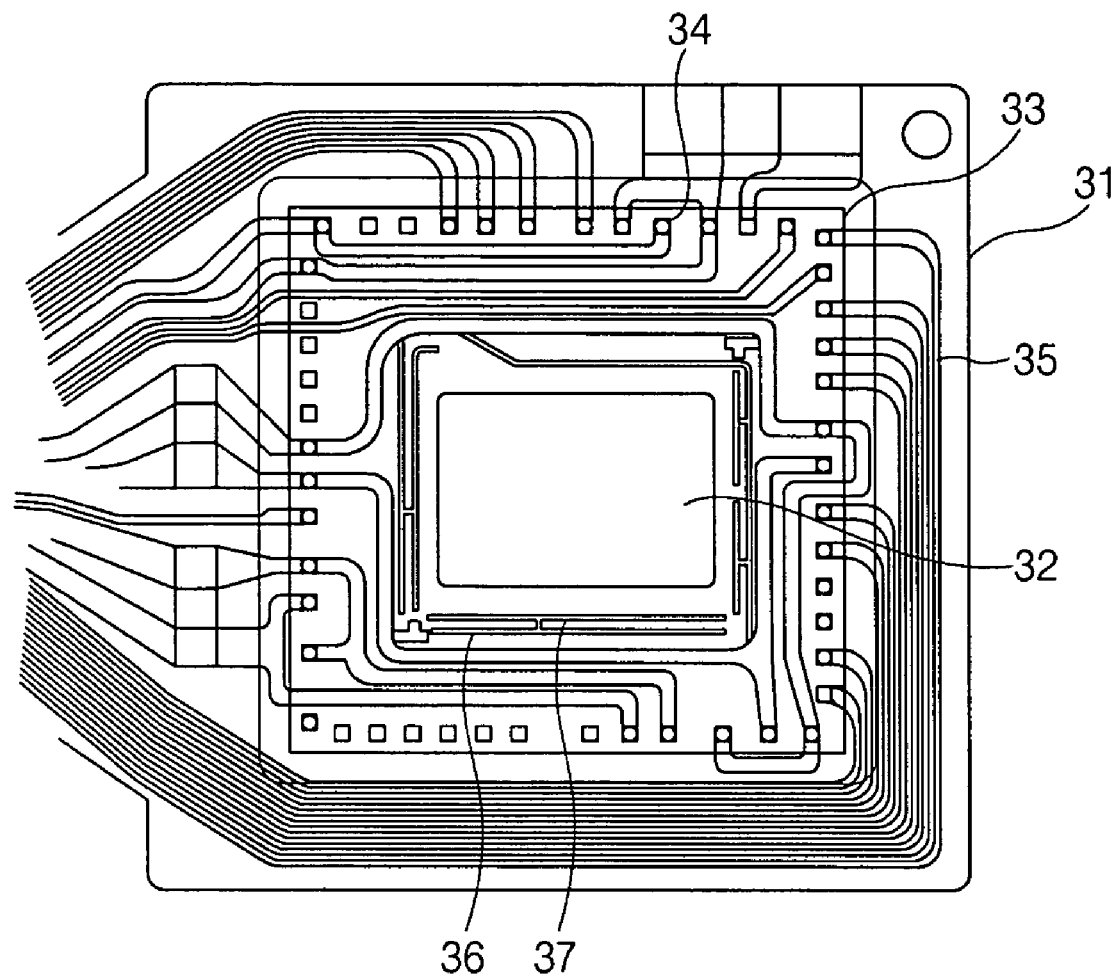
[FIG. 6]

[FIG. 7]
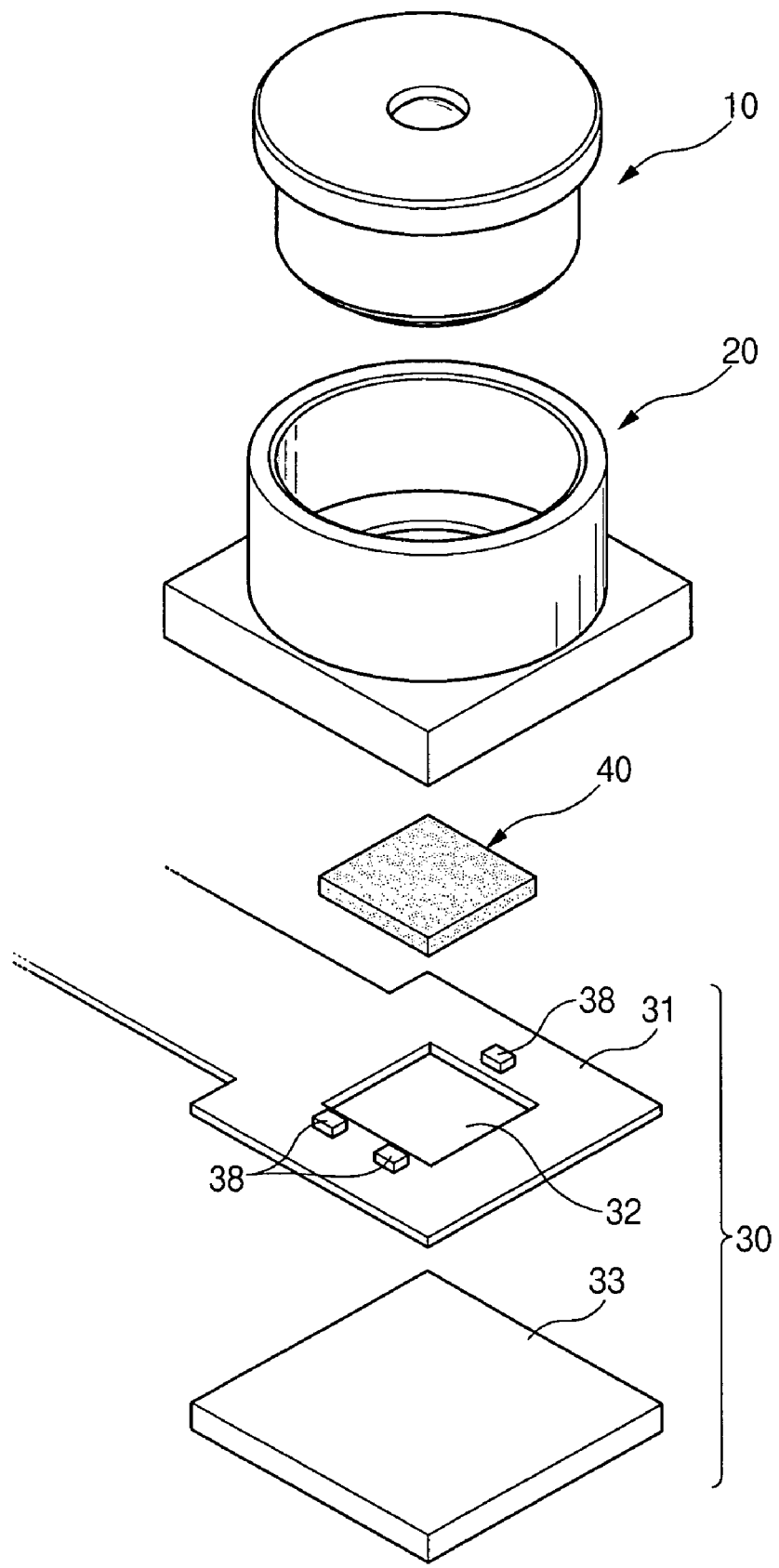

[FIG. 8]
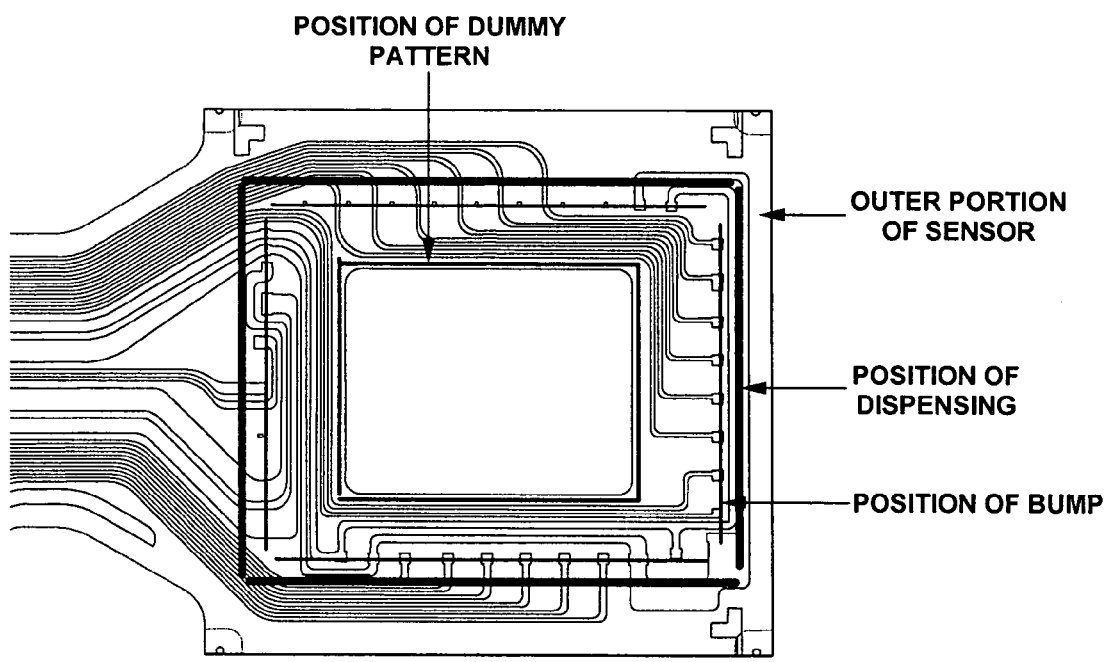

IMAGE SENSOR MODULE AND CAMERA MODULE PACKAGE HAVING THE SAME

CROSS-REFERENCE TO RELATED APPLICATIONS

This application claims the benefit of Korean Patent Application No. 2005-113823 filed with the Korean Industrial Property Office on Nov. 25, 2005, the disclosure of which is incorporated herein by reference.

BACKGROUND OF THE INVENTION

1. Field of the Invention

The present invention relates to an image sensor module and a camera module package having the same, which are used in mobile equipments or various monitoring devices. The image sensor module and the camera module package can be applied when bumps of an image sensor such as a complementary metal oxide semiconductor (CMOS) and an image sensor module board are directly connected to each other by using non-conductive paste (NCP).

2. Description of the Related Art

As the information communication technology rapidly develops, data communication speed is improved, and an amount of data communication is expanded. Further, an imaging device such as a CCD image sensor or CMOS image sensor is mounted on mobile electronic equipments such as mobile phones or notebooks, and thus image data as well as text data can be transmitted in real-time, the image data being taken by a camera module.

As for a method of packaging an image sensor for camera, there are provided a flip-chip COF (Chip On Film) method, a wire-bonding COB (Chip On Board) method, and a CSP (Chip Scale Package) method, among which the COF method and the COB method are widely used.

The COB method is a similar process to that of an existing semiconductor production line and has higher productivity than other packaging methods. However, since wire should be used for the connection with a PCB, the size of a module increases and an additional process is needed. Therefore, a new packaging technique is required to reduce the size of chip, to enhance heat dissipation and electrical performance, and to improve reliability. Accordingly, a COF method has emerged based on bumps having an external bonding projection.

In the COF method, a space for attaching wire is not needed. Therefore, the area of a package and the height of a lens barrel can be reduced. Further, since a thin film or flexible printed circuit board (FPCB) is used in the COF method, a reliable package which endures an external impact can be manufactured and the process thereof is relatively simplified. Moreover, the COF method satisfies such a tendency that signals are processed at high speed, high density is required, and multiple pins are needed.

Further, in a module using a mega-quality sensor to which various functions are added, the miniaturization of module, which has been a merit of the COF method, is not realized any more, because of the one-story structure thereof. The module cannot but be designed to have a larger size than in the COB method.

Currently, a double-sided flexible printed circuit board (FPCB) is used so that a module can be designed to have a similar size to that in the COB method, which does not satisfy the miniaturization of module which is a merit of the COF method. Therefore, since the COB method tends to be frequently used, the design and process technique for realizing the miniaturization of module are required.

Now, a conventional image sensor module using the COF method and a method of manufacturing the same will be described with reference to accompanying drawings, and the problems thereof will be examined.

FIG. 1 is a plan view illustrating the conventional image sensor module using the COF method.

As shown in FIG. 1, the image sensor module 30 includes an image sensor 33 which picks up an image to process into an electrical signal and a flexible printed circuit board (FPCB) 31 which is attached to the image sensor 33 so as to deliver a signal to the outside.

The image sensor 33 includes a pixel region (light receiving section) picking up an image from light incident from the outside and a signal processing region (ISP) having pads 34 formed on the outer portion of the image sensor so as to process an electrical signal with respect to the image picked up by the pixel region.

The FPCB 31 has a window 32 formed to have such a predetermined size that light received from a condensing lens of a lens section mounted on a housing passes through the window 32 so as to reach the image sensor 33.

The image sensor 33 is attached on the rear surface of the FPCB 31 by a flip-chip bonding method. The flip-chip bonding method is roughly classified into an ACF process and an NCP process. In the ACF process, an anisotropic conductive film (ACF) is inserted between the rear surface of the FPCB 31 and bumps projecting on the pads of the image sensor 33 and is then pressed so as to be attached. In the NCP process, non-conductive paste (NCP) is put between the rear surface of the FPCB 31 and the bumps projecting on the pads of the image sensor 33 and is then pressed so as to be attached. Through the flip-chip bonding method, a element-side electrode pads formed in the image sensor 33 are electrically connected to board-side electrode pads formed on the FPCB 31, and an electrical signal is delivered to an external mother board or the like via the circuit pattern 35 formed on the FPCB 31. Then, the image sensor module 30 coupled to the housing having the lens section is completed.

The flip-chip bonding method, in which the image sensor 33 is attached on the rear surface of the FPCB 31, will be described concretely.

In the ACF process in which such processes as shown in FIG. 2 are performed, an anisotropic conductive film of which the center portion is perforated to a predetermined size is aligned on the portion where the board-side pads are positioned. Then, pre-compression is performed so as to attach the film and the board.

Next, the image sensor having conductive bumps formed of silver or the like is positioned so as to correspond to the circumference of the film.

Next, the image sensor is heated at predetermined temperature so as to be pressed and attached on the board, so that the bumps formed in the image sensor and the pads formed on the board are connected to each other in a circuit manner.

Next, the peripheral portion of the image sensor is side-filled with resin or the like. Finally, a curing process is performed to complete manufacturing the image sensor module.

In the NCP process in which such processes as shown in FIG. 3 are performed, an image sensor having conductive bumps formed of silver or the like is first prepared.

Next, on a board having board-side pads formed, non-conductive paste (NCP) is dispensed in such a rectangular shape as to cover the pads.

Next, the image sensor having the conductive bumps formed thereon is positioned on the board on which the NCP is dispensed.

Finally, the image sensor having the conductive bumps formed thereon is heated and pressed, so that the bumps formed on the image sensor and the pads formed on the board are connected to each other in a circuit manner. Then, the board and the image sensor are pressed so as to be attached to each other, thereby completing manufacturing the image sensor module.

In the above-described COF packaging method, when the non-conductive paste of the NCP process is used instead of the anisotropic conductive film of the ACF process, a material cost can be reduced, and high durability against an external condition is provided to secure a highly reliable quality.

In spite of such advantages of the NCP process, the following problem occurs. When an image sensor is pressed and attached by a bonding device after non-conductive paste used as paste when the NCP process is applied is quantitatively coated on a board, an overflow (portion A) of non-conductive paste occurs where liquid-state non-conductive paste is overflowed into the image sensor, as shown in FIG. 4. Such an overflow causes fatal defects in image formation of the completed image sensor module. FIG. 4 shows a photograph for explaining the problem occurring when the NCP process for the COF packaging method is performed.

SUMMARY OF THE INVENTION

An advantage of the present invention is that it provides an image sensor module and a camera module package using the same. In the image sensor module and the camera module package using the same, when an image sensor is pressed and attached by a bonding device after a liquid adhesive such as non-conductive paste used as paste when an NCP process of a COF packaging method is performed is quantitatively coated on a board, the liquid adhesive is prevented from being overflowed into a pixel region of the image sensor, which makes it possible to remove defects in forming an image.

Additional aspect and advantages of the present general inventive concept will be set forth in the description which follows and, in part, will be obvious from the description, or may be learned by practice of the general inventive concept.

According to an aspect of the invention, an image sensor module comprises an image sensor including a pixel region picking up an image input from the outside and a signal processing region having bumps formed in the outer portion of the image sensor so as to process an electrical signal with respect to the image picked up by the pixel region; and a board attached to the image sensor by a liquid adhesive and provided with a window such that the pixel region of the image sensor receives light, the board including: a first dummy pattern formed on at least a portion around the window; a circuit pattern formed in a position spaced in a predetermined distance outward from the first dummy pattern; and board-side pads electrically connected to the circuit pattern so as to come in contact with the bumps formed in the image sensor.

According to another aspect of the present invention, the liquid adhesive is non-conductive polymer (NCP).

According to a further aspect of the present invention, the liquid adhesive is dispensed on the more outer portion than the position where the board-side pads are formed.

According to a still further aspect of the present invention, the first dummy pattern is patterned in a rectangular shape.

According to a still further aspect of the present invention, the first dummy pattern is a continuous pattern line.

According to a still further aspect of the present invention, the first dummy pattern is a discrete pattern line.

According to a still further aspect of the present invention, the image sensor module further comprises a second dummy pattern between the first dummy pattern and the circuit pattern.

According to a still further aspect of the present invention, the first dummy pattern and the second dummy pattern are integrally formed so as to be connected to each other.

According to a still further aspect of the present invention, a camera module package comprises a lens barrel having a plurality of lenses mounted thereon; an image sensor module according to the aspect of the invention, the image sensor module picking up an image from light transmitted through the lens barrel; and a housing coupled to the lens barrel from the upper end thereof and coupled to the image sensor module from the lower end thereof.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view illustrating a conventional image sensor module for a COF packaging method;

FIG. 2 is an ACF process diagram for the COF packaging method;

FIG. 3 is an NCP process diagram for the COF packaging method;

FIG. 4 is a plan view for explaining problems occurring when the NCP process for the COF packaging method is performed;

FIG. 5 is a plan view illustrating an image sensor module board according to an embodiment of the invention;

FIG. 6 is a plan view illustrating an image sensor module board according to another embodiment of the invention;

FIG. 7 is an exploded perspective view illustrating an image sensor module, to which the image sensor module board according to the invention is applied, and a camera module package using the image sensor module; and FIG. 8 is a diagram schematically showing a positional relationship among the board, a dummy pattern, adhesive means such as NCP, and bumps, which are used for manufacturing the image sensor module according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, preferred embodiments of the present invention will be described in detail with reference to the accompanying drawings.

Image Sensor Module Board

FIG. 5 is a plan view illustrating a image sensor module board according an embodiment of the present invention, and FIG. 6 is a plan view illustrating a image sensor module board according to another embodiment of the invention.

FIG. 5 shows that a first dummy pattern 36 having a continuous shape is formed on the image second module board 31. Although being described below, an image sensor module 30 includes an image sensor 33 which picks up an image to process into an electrical signal and the board (printed circuit board) 31 to which the image sensor 33 is attached and which has a circuit pattern 35 formed so as to deliver a signal to the outside.

In general, the image sensor 33 includes a pixel region (light receiving section) which picks up an image from light input from the outside and a signal processing region (ISP) having pads 34 formed in the peripheral portion of the image sensor so as to process an electrical signal with respect to the image picked up by the pixel region.

The board 31 according to the invention has a window 32 formed to have such a predetermined size that light received from a condensing lens of a lens section 10 mounted on a housing 20 to be described below can pass through the window 32 to reach the image sensor 33. As for the board 31, a flexible printed circuit board (FPCB) or rigid flexible printed circuit board (RFPCB) may be used. The FPCB and RFPCB may be formed of a resin board formed of polyimide having flexibility. Particularly, when a double-sided FPCB or RFPCB is used as the board 31, at least one or more electric parts 38 such as MLCC can be mounted on the opposite surface (upper surface) to one surface (lower surface) of the board 31 having the image sensor 33 attached thereto. Therefore, it is possible to reduce the overall size of the image sensor module.

Around the window 32, the dummy pattern 36 is formed in a shape surrounding the window 32. When a liquid adhesive such as non-conductive paste (NCP) is dispensed and coated between the rear surface of the board 31 and bumps projecting on the pads of the image sensor 33 and is then pressurized and attached, the dummy pattern 36 serves as a preventing wall which prevents the liquid adhesive from penetrating into the window 32 corresponding to the pixel region of the image sensor 33. The dummy pattern 36 can be patterned on the board 31 at the same time when a general circuit pattern 35 is formed. Alternately, only the dummy pattern 36 can be formed separately.

As shown in FIG. 5, the dummy pattern 36 can be patterned into a continuous line having a rectangular shape surrounding the window 51 or can be patterned into a discrete line. However, when a liquid adhesive such as NCP is dispensed and coated on the board 31, the liquid adhesive can be massed in the last process (in the range of about 330 to 360 degrees) where the start point and end point of dispensing coincide with each other and overlap each other. Then, the liquid adhesive overflows into the window 32 of the board 31 when a subsequent pressing process is performed. Therefore, it is preferable that patterning is performed so that the dummy pattern 36 is formed in a portion corresponding to a portion where the start point and end point of dispensing overlap each other.

In the image sensor module 30, the circuit pattern 35 formed on the board 31 is spaced at a predetermined distance outward from the window 32 because of a noise problem, which means that the dummy pattern 36 can be formed between the window 32 and the circuit pattern 35. Therefore, if a space for forming a separate additional dummy pattern is provided after the dummy pattern 36 and the circuit pattern 35 are formed, it is preferable that an additional second dummy pattern 37 is formed, as shown in FIG. 6. Further, when it is determined that a space for such an addition second dummy pattern 37 is secured at the stage of design, it is more preferable that the second dummy pattern 37 is integrally formed when the first dummy pattern 36 is formed. FIG. 6 shows that double dummy patterns are formed on the image sensor module board.

Meanwhile, the bump formed on the image sensor may be any one of a stud bump, an electrolytic bump, and a non-electrolytic bump, among which the stud bump is advantageous in terms of the reliability of a product because the height of the bump can be reduced so as to improve the step between ceramic leads.

The circuit pattern 35 formed so as to deliver an electrical signal from the image sensor 33 to an external mother board or the like is patterned in a position spaced at a predetermined distance outward from the dummy pattern 36, and board-side pads 34 are also formed which is electrically connected to the circuit pattern 35 so as to receive an electrical signal from the image sensor 33. Outside the board-side pads 34, a liquid adhesive such as NCP is dispensed and coated on the board 31.

As such, through such a process that a liquid adhesive such as NCP is dispensed and coated between the rear surface of the board 31 and the bumps projecting on the pads of the image sensor 33 and is then pressurized and attached, element-side electrode pads formed on the image sensor 33 are electrically connected to the board-side electrode pads formed on the board.

Image Sensor Module and Camera Module Package

FIG. 7 is an exploded perspective view illustrating an image sensor module to which the image sensor module board according the invention is applied and a camera module package using the image sensor module.

As shown in FIG. 7, the camera module package includes a lens barrel (lens section 10), a housing 20 into which the lens section 10 is inserted from an upper opening thereof so as to be mounted, and an image sensor module 30 coupled to a lower opening of the housing 20.

The housing 20 is a typical support and has openings formed in the upper and lower portions thereof. The openings are coupled to the lens section 10 and the image sensor module 30, respectively. On the inner circumference of the housing at the lower opening, a guide is formed to project toward the inside of the housing, the guide serving as a positioning section when the housing and the image sensor module 30 are coupled to each other.

The lens section 10, which is inserted and coupled to the upper opening of the housing 20, serves as a lens holder and is formed of resin such as polycarbonate. An aperture, a condensing lens and the like are installed in the bottom side of the housing 20. The aperture defines a passage of light passing through the condensing lens, and the condensing lens serves to cause the light transmitted through the aperture to be received by a light receiving section of the image sensor. On the upper surface of the lens section 10, IR-coated glass is attached so as to prevent foreign matters from penetrating into the aperture or condensing lens.

The image sensor module 30 coupled to the lower opening of the housing 20 includes the board 31 and the image sensor 33 which is attached on the board 31 so as to receive and process light transmitted through the window 32 formed on the board 31. Further, one end of the board 31 is connected to a connector (not shown).

A specific process for manufacturing the image sensor module according to the invention will be described. FIG. 8 is a diagram schematically showing a positional relationship among the board, the dummy pattern, the attaching means such as NCP, and the bumps, which are used for manufacturing the image sensor module.

First, the image sensor 33 having conductive bumps formed of silver or the like is prepared.

Next, in the board 31 on which the dumpy patterns 36 and 37 and the board-side pads are formed, a liquid adhesive such as NCP is dispensed and coated in such a rectangular shape as to cover the pads. The liquid adhesive is dispensed on the board 31 so as to be coated on the outside of the position where the board-side pads 34 are formed.

Next, the image sensor 33 having the conductive bumps formed is positioned on the board 31 on which the NCP is dispensed.

Finally, while the image sensor 33 having the conductive bumps formed on the board 31 on which the liquid adhesive such as NCP is dispensed is heated and pressed, the bumps formed on the image sensor 33 and the pads formed on the board 31 are connected to each other in a circuit manner, thereby completing the image sensor module 30. Although such a pressing process is performed, the dummy pattern 36 prevents the liquid adhesive from penetrating into the window 32 of the board corresponding to the pixel region of the image sensor 33.

When a double-sided FPCB or RFPCB is used as the board, at least one or more electric parts 38 such as a multilayer ceramic capacitor (MLCC) and the like can be mounted on the opposite side (upper surface) to one side (lower surface) of the FPCB having the image sensor attached so as to be included inside the housing, which makes it possible to reduce the overall size of the image sensor module in comparison with the related art. The electric parts 38 which can be mounted on the image sensor module 30 include at least one or more multilayer ceramic capacitors (MLCC). Further, the electric parts 38 can additionally include other electric parts such as a resistor, a diode, a transistor and so on. The multi-layer ceramic capacitor (MLCC) serves to remove screen noise occurring in a camera module, and other electric parts can be used for quality improvement except for the removal of screen noise. Further, as semiconductors recently develops in such a trend as high performance and high integration, a multi-chip package and a three-dimensionally stacked structure are integrated, thereby implementing a slim and compact package.

According to the image sensor module and the camera module package of the present invention, the liquid adhesive such as NCP, which is used as paste when a liquid adhesive is applied as in an NCP process of packaging methods according to the COF method, is quantitatively coated on the board, and the image sensor is then pressed by a bonding device. In this case, the liquid adhesive is prevented from penetrating into the pixel region of the image sensor, which makes it possible to reduce a percent defective in image formation.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An image sensor module comprising:
   an image sensor including:
      a pixel region picking up an image from light incident from the outside; and
      a signal processing region having bumps formed in the outer portion of the image sensor so as to process an electrical signal with respect to the image picked up by the pixel region; and
   a board attached to the image sensor by a liquid adhesive and provided with a window such that the pixel region of the image sensor receives light, the board including:
      a first dummy pattern formed on at least a portion around the window corresponding to a portion in which a start point and an end point of a dispensing of the liquid adhesive overlap;
      a circuit pattern formed on a same surface of the board as the first dummy pattern and in a position spaced a predetermined distance outward from the first dummy pattern such that the first dummy pattern is positioned between the window and the circuit pattern; and
      board-side pads electrically connected to the circuit pattern so as to come in contact with the bumps formed in the image sensor.

2. The image sensor module according to claim 1, wherein the liquid adhesive is non-conductive polymer (NCP).

3. The image sensor module according to claim 1, wherein the liquid adhesive is dispensed on the more outer portion than the position where the board-side pads are formed.

4. The image sensor module according to claim 1, wherein the first dummy pattern is patterned in a rectangular shape.

5. The image sensor module according to claim 1, wherein the first dummy pattern is a continuous pattern line.

6. The image sensor module according to claim 1, wherein the first dummy pattern is a discrete pattern line.

7. The image sensor module according to claim 1 further comprising a second dummy pattern between the first dummy pattern and the circuit pattern.

8. The image sensor module according to claim 1, wherein the first dummy pattern and the second dummy pattern are integrally formed so as to be connected to each other.

9. A camera module package comprising:
   a lens barrel having a plurality of lenses mounted thereon;
   an image sensor module according to claim 1, the image sensor module picking up an image from light transmitted through the lens barrel; and
   a housing coupled to the lens barrel from the upper end thereof and coupled to the image sensor module from the lower end thereof.

* * * * *